United States Patent [19]

Shimazu et al.

[11] 4,248,102
[45] Feb. 3, 1981

[54] PUSH BUTTON TYPE TUNER APPARATUS

[75] Inventors: Teruo Shimazu, Atsugi; Yoshihiko Maejima, Numazu, both of Japan

[73] Assignee: Mitsumi Electric Co. Ltd., Chofu, Japan

[21] Appl. No.: 958,954

[22] Filed: Nov. 7, 1978

[30] Foreign Application Priority Data

| Nov. 17, 1977 [JP] | Japan | 52-154571[U] |
| Dec. 2, 1977 [JP] | Japan | 52-160985[U] |
| May 15, 1978 [JP] | Japan | 53-64769[U] |

[51] Int. Cl.³ .............................................. H03J 1/06
[52] U.S. Cl. ....................................... 74/10.33; 334/7
[58] Field of Search ................. 74/10.33, 10.37; 334/7

[56] References Cited

U.S. PATENT DOCUMENTS

| 3,602,051 | 8/1971 | Olah | 334/7 X |
| 3,863,509 | 2/1975 | Zimatore | 334/7 X |
| 3,943,779 | 3/1976 | Ganderton | 74/10.33 |
| 3,946,344 | 3/1976 | Wilkinson | 74/10.33 X |

FOREIGN PATENT DOCUMENTS 2727748  1/1978  Fed. Rep. of Germany ............. 334/7

*Primary Examiner*—Allan D. Herrmann

[57] ABSTRACT

A push button type tuning apparatus comprising a plurality of push buttons adapted to be pressed at the time of preset tuning and retuning operations, memory plates provided rotatably with respect to each of the push buttons, clamp plates provided with respect to each of the push buttons and adapted to clamp the memory plates through preset tuning manipulation, a slide plate adapted to slide in connection with a tuning part on manual tuning or retuning by the push buttons, and comparators pivotally supported on the push plate to which the push button are fixed and having position-restriction parts, the position-restriction parts restricting the memory plate to a position registered with the slide plate on preset tuning, and restricting the slide plate to a position registered with the memory plate after it has been clamped on retuning. A journal-bearing part of the memory plate comprises a round pin and a hole having the shape of, for example, a triangle in which the pin is to be fitted, and the journal-bearing part is manitained stably with the pin making contact with the sides of the hole at two different points.

10 Claims, 16 Drawing Figures

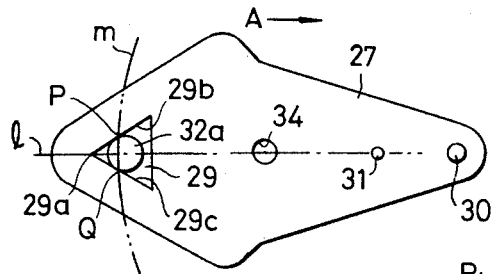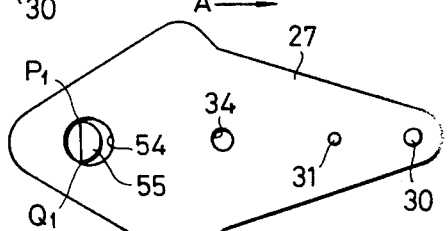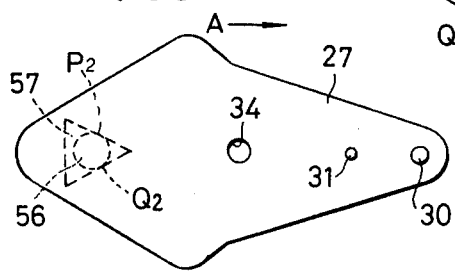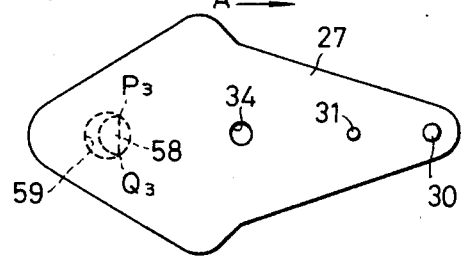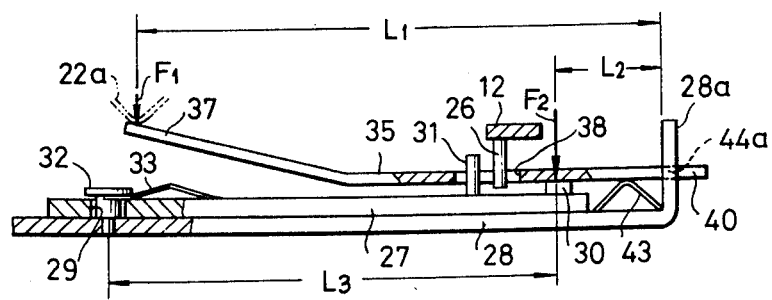

4,248,102

PUSH BUTTON TYPE TUNER APPARATUS

BACKGROUND OF THE INVENTION

The present invention relates generally to a push button type tuner apparatus, more particularly to a push button tuner wherein a member for memorizing a preset position is positively held at the preset position without possibility of any deviation of set position, and is thus capable of carrying out preset tuning and reset tuning (re-tuning) with high accuracy.

In general, a push button type tuner apparatus is arranged so as to preset a desired station. That is, a rotatable knob is firstly turned to drive a tuning mechanism to tune the desired station, and then a push button is pressed to cause a memory plate to undergo displacement to a position in conformance with the above tuning and to clamp the memory plate thus displaced, thus memorizing the desired station. For re-tuning the preset or memorized station, the push button is pressed, which drives the tuning mechanism in accordance with the position of the memory plate which has been locked, and thus the desired station is tuned.

In push button tuners of this type known heretofore, a circular hole near one end of the memory plate is fitted on a pin of circular section, and is thus mounted pivotally on the pin. The memory plate is generally urged to move in one direction and then clamped. In this clamped state, the journal bearing part of the memory plate assumes a state wherein the inner peripheral surface of the round hole and the peripheral surface of the circular cylinder pin make contact each other at a single point, with the other parts threof being somewhat separated from each other.

Accordingly, when in the clamped state the memory plate is subject to unstable factors, and there is danger that the memory plate will be accidentally joggled or shifted at a journal-bearing part thereof when an external impact is applied thereto, thus decreasing reliability. If the memory plate is accidentally shifted, the tuning frequency to be reset through pushing operation of the push button will differ from the original preset tuning frequency, thus impairing the accuracy of the preset and reset tuning.

SUMMARY OF THE INVENTION

Accordingly, it is a general object of the present invention to provide a novel and useful push button type tuner apparatus in which the above described difficulty has been overcome.

Another and specific object of the present invention is to provide a push button type tuner apparatus in which the journal-bearing part of the memory plate has mechanical contact at two separate points. With this construction, the memory plate is clamped in a stable manner without possibility of any shifting, thus ensuring high accuracy in preset and reset tuning.

Still another object of the present invention is to provide a push button type tuner apparatus in which the free end side of the memory plate is pressed with fairly large force, thus clamping the plate securely. This construction effectively prevents any shifting of the memory plate from the clamped position.

A further object of the present invention is to provide a push button type tuner apparatus in which a clamp plate is adapted to be attached to an apparatus through a simple operation and so it will have less play. According to this construction, shifting the memory plate caused by joggling of the clamp plate itself does not occur.

Other object and further features of the invention will be apparent from the following detailed description with respect to the preferred embodiments of the present invention when read in conjunction with the accompanying drawings.

BRIEF DESCRIPTION OF THE DRAWINGS

In the drawings:

FIG. 10 is a plan view showing a journal-bearing when a memory plate is in clamped state;

FIGS. 11 through 13 are plan views, respectively showing other embodiments of a memory plate pivot mechanism, while the memory plate is in a clamped state; and FIG. 14 is a side view, with fragmentary vertical section, showing a memory plate clamp mechanism in use operation, on a large scale.

DETAILED DESCRIPTION

Figure 1:
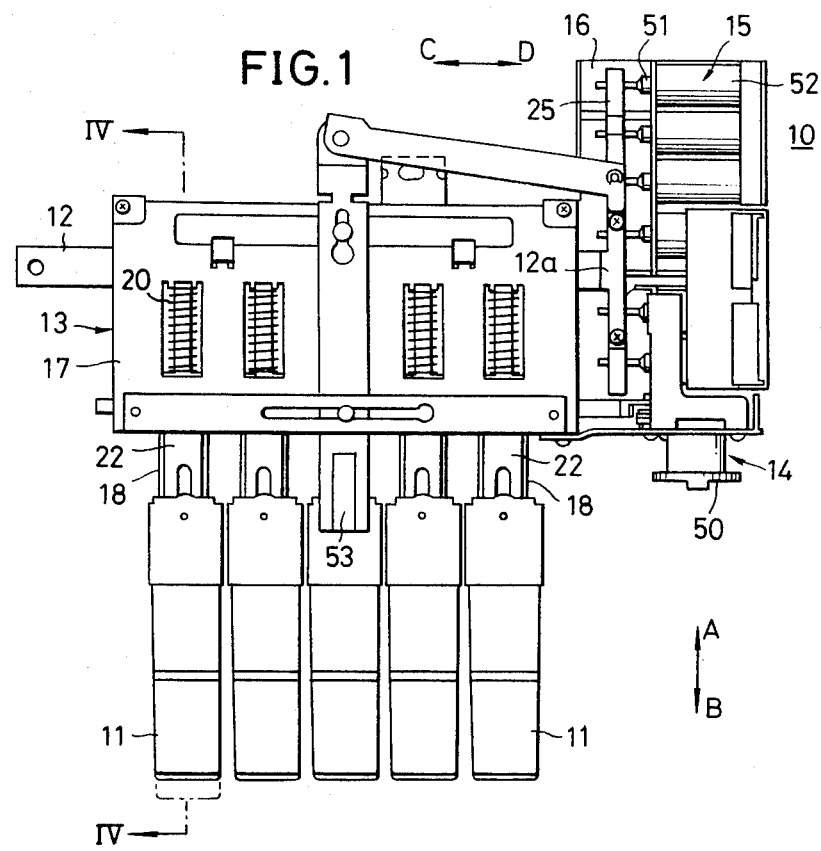
FIG. 1 and FIG. 2, and FIG. 3 are, respectively, a plan view, an elevational view, and a side view, showing one embodiment of a push button type tuner apparatus according to the present invention.
Figure 2:
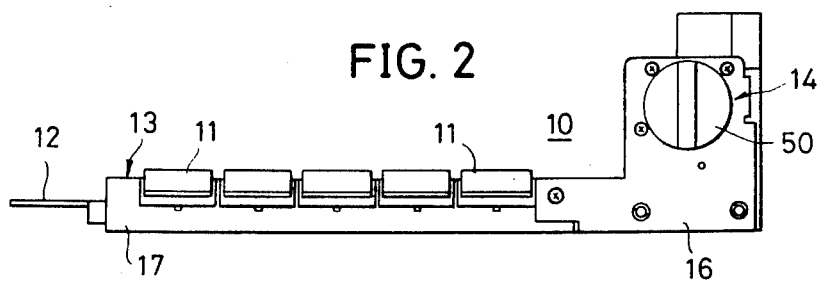
Figure 3:
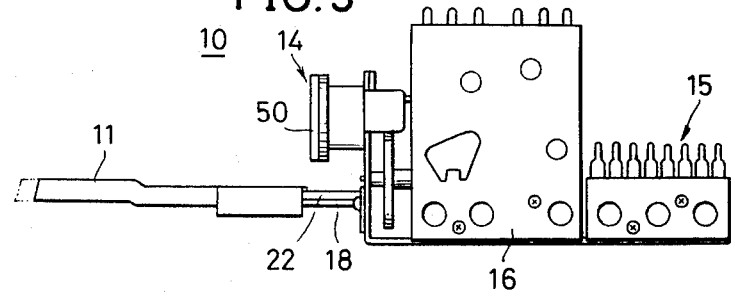

Referring to FIGS. 1 through 3, a push button tuner apparatus substantially comprises a main body frame 13 provided with five push button 11 and a single slide plate 12, and a frame 16 provided with a manual tuning mechanism 14 and a tuning section 15, the former and the later being screwed together.

Figure 4:
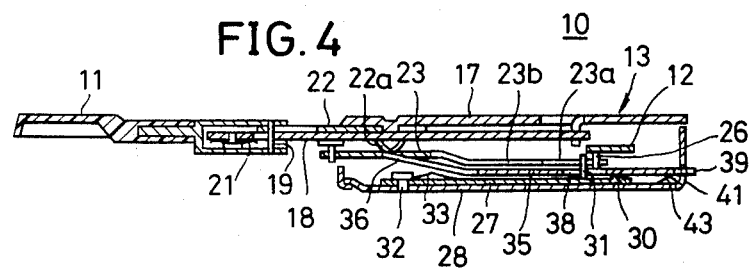
FIG. 4 is a side view, in vertical section, taken along the line IV—IV in FIG. 1, as viewed in the arrow direction.
Figure 5:
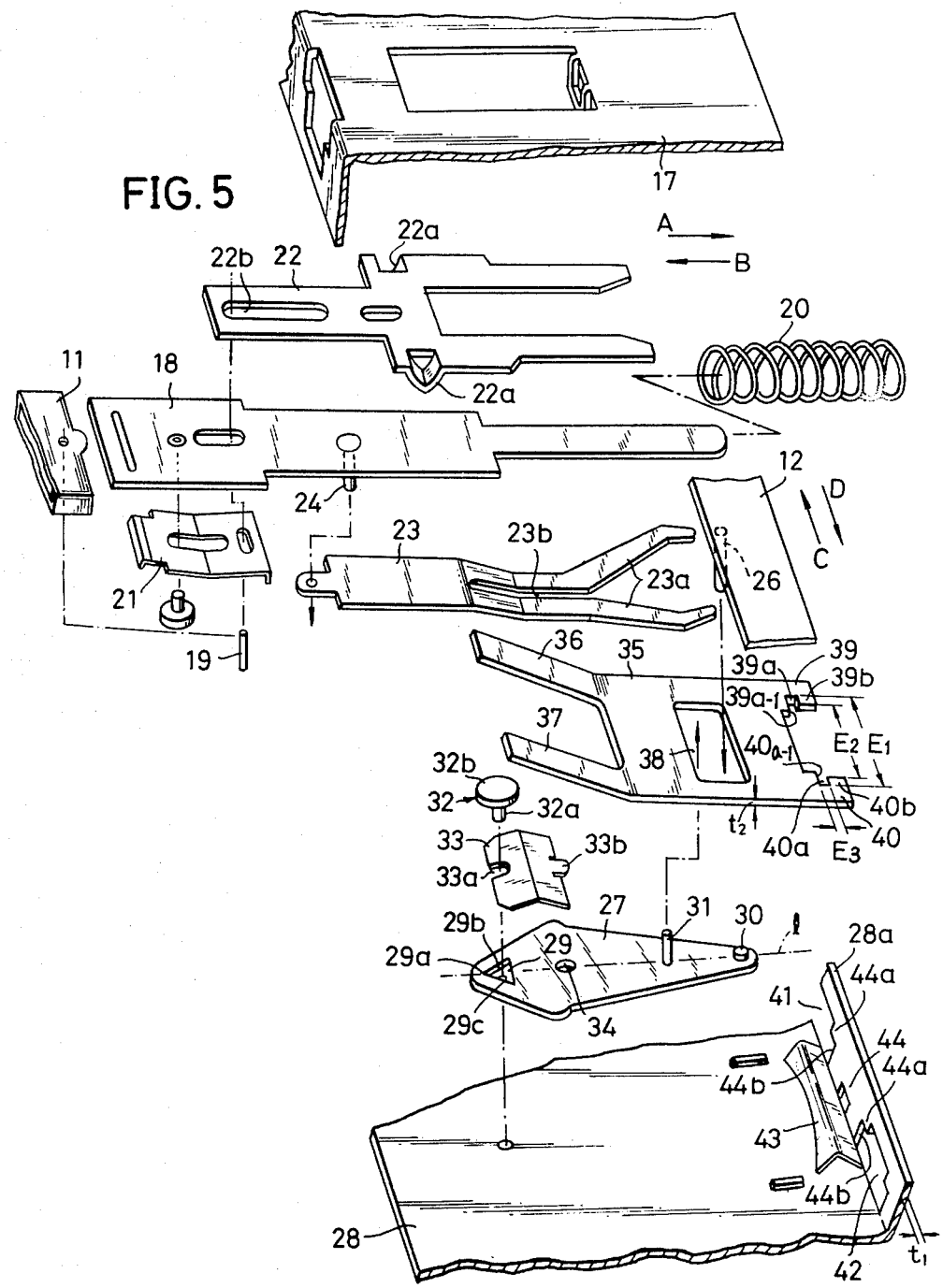
FIG. 5 is an exploded perspective view of an essential part of the push button type tuner apparatus shown in FIG. 1.

The push botton 11 is fixed by a pin 19 to a push plate 18 which is slidably fitted to a top cover 17, as indicated in FIG. 4 and FIG. 5. When the push button 11 is depressed, it moves in the direction indicated by arrow A against a coil spring 20, and when the depressing force is removed, returns to its original position due to the action of the spring 20 in the direction indicated by arrow B. Moreover, the push button 11 is adapted to slide with respect to the push plate 18 over a predetermined distance in the directions indicated by arrows A and B, and to be latched at respective position by the action of a leaf spring 21.

A lock plate 22 has a pair of locking, projections 22a, and is moved in the directions indicated by arrows A and B, by the pin 19 which abuts against the opposite ends of a slot 22b, as the push button 11 is independently shifted with respect to the push plate 18.

A Y-shaped comparator 23 comprises V-shaped prongs 23a and a guide groove 23b, and is pivotally supported at the side near the push button 11 by a pin 24 fixed in the push plate 18. The guide groove 23b extends from the bottom of the V-shaped prongs 23a in the longitudinal direction of the comparator 23.

The right end T-shaped part 12a of a slide plate (tuning plate) 12 is screwed to a slide bar 25, and undergoes sliding in the direction indicated by arrows C and D, as indicated in FIG. 1. The slide plate 12 has five downwardly projecting pins 26, each of which corresponds to one of the push buttons 11.

A memory plate (reference plate) 27 is disposed on a bottom cover 28 in correspondence with each push button 11, and each is pivotally supported at its side near the push button 11 so as to turn through a predetermined angle of rotation. The memory plate 27 has a hole 29 in the shape of an equilateral triangle near one end thereof, which constitutes an essential part of the present invention, and at a part near the other end thereof, a projection (clamped part) 30 to which a clamping force is applied by a clamp plate 35 as described hereinafter.

This equilateral triangle hole 29 is positioned symmetrically with respect to a longitudinal center line l of the memory plate 27, with one vertex 29a on the line l. A pin 31 is embedded in the memory plate 27 on the longitudinal center line l, away from the center toward the projection 30.

The shape of the hole 29 is not limited to the above equilateral triangle, but may be an isosceles triangle.

The memory plate 27 is pivotally mounted by a pin 32 with head which passes through the triangle hole 29 and is embedded in the bottom cover 28. This headed pin 32 comprises a circular cylinder part 32a which loosely fits in the triangle hole 29, and a large-diameter head 32b for preventing detachment of the memory plate 27.

An inverted V-shaped leaf spring 33 is fitted to the journal-bearing part of the memory plate 27, with one side thereof press-fitted into a gap between the memory plate 27 and the head 32b of the pin 32, and the other side contacting the upper surface of the memory plate 27. The memory plate 27 is therefore urged by the leaf spring 33 toward the bottom cover 28 and thus makes positive contact with the bottom cover 28. Accordingly, the memory plate 27 will be held at a predetermined position of rotation without any play in the direction of thickness thereof. The leaf spring 33 is fitted so that a recess 33a in one side engages with the cylinder part 32a of the pin 32 and a tongue 33b projecting at the other side fits into a hole 34 in the memory plate 27, whereby such problems as the leaf spring 33 shifting with respect to and becoming detached from the memory plate 27 do not occur.

Figure 7:
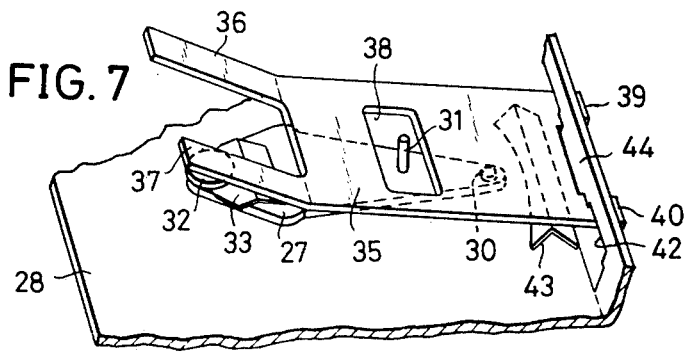
FIG. 7 is a perspective view showing the relationship between a clamp plate fitted to a bottom cover and a memory plate.

The clamp plte 35 has a pair of clamping arms 36 and 37 which extend obliquely upwards, a square opening 38, and a pair of engagement lugs 39 and 40. This clamp plate 35 is attached to the bottom cover 28 as indicated in FIG. 7, with the engagement lugs 39 and 40 being engaged with engagement holes 41 and 42 formed in an upstanding rear wall 28a of the bottom cover 28. The clamp plate 35 thus attached is positioned above the memory plate 37 and below the lock plate 22 and the slide plate 12, as shown in FIG. 4. The pins 26 and 31 are positioned in the square opening 38. Moreover, the clamp plate 35 is laid onto an inverted V-shaped leaf spring 43 fitted to the bottom cover 28 near the rear wall 28a, and is usually turned upwards about the engagement lugs to its inoperative (unclamped) position.

Figure 8:
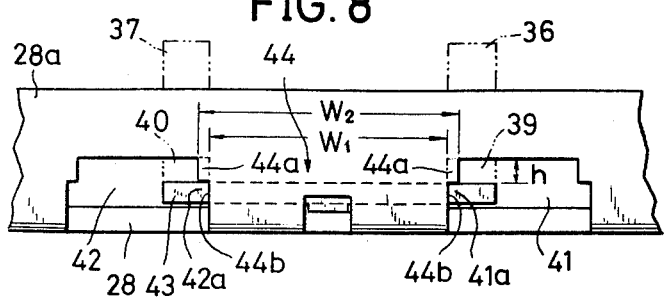
FIG. 8 is a rear view of a bottom cover, showing configuration of recesses in the rear side thereof, in which recesses a clamp plate is to be fitted.

Here, with further reference to FIG. 8, a description is given of a mechanism for attaching the clamp plate 35 to the bottom cover 28.

The pair of engaging lugs 39 and 40 are hook (inverted-L) shaped, and respectively have recesses 39a and 40a, and hook parts 39b and 40b. These lugs 39 and 40 are on opposite lateral sides of the clamp plate 35 and face each other. The distance between the recesses 39a and 40a is set as $E_1$, and the distance between the hook parts 39b and 40b is set as $E_2$ ($< E_1$). The width $E_3$ of each recess 39a and 40a is somewhat greater than the thickness $t_1$ of the upstanding wall 28a.

The engagement holes 41 and 42 are formed in the upstanding wall 28a at positions spaced from each other by a predetermined distance, as indicated in FIG. 8. A support part 44 is thus formed in the upstanding wall 28b between the holes 41 and 42. The engagement holes 41 and 42 respectively comprise upper narrow parts and lower wide parts, thus forming steps 44a and cuts 44b in opposite sides of the support part 44.

In the support part 44, the width $W_1$ between opposite cuts 44b is slightly less than the above dimension $E_2$, and another width $W_2$ between opposite steps 44a is also slightly less than the above dimension $E_1$. Moreover, the height h of the step 44a is substantially equal to thickness $t_2$ of the clamp plate 35.

To attach the clamp plate 35 to the bottom cover 28 the procedure is as follows. Firstly, in the assembling, the clamp plate 35 is held by arms 36 and 37 in such a manner that the engagement lugs 39 and 40 respectively confront the engagement holes 41 and 42. Then, the hook parts 39b and 40b are respectively inserted into the engagement holes 41 and 42 at their space parts 41a and 42a which are formed by the above cuts 44b. The inserting operation of the clamp plate 35 is restricted, with lateral walls 39a-1 and 40a-1 of the recesses 39a and 40a abutting against the support part 44, and, in this inserted position, the recesses 39a and 40a of the clamp plate 35 respectively confront the steps 44a of the support part 44.

Thereafter, the clamp plate 35 is lowered so that the clamp arm side thereof approaches the memory plate 27. As the clamp plate 44 is lowered, it comes into contact with an angle leaf spring 43 and then rotates about the contact part as a fulcrum. With rotation of the clamp plate 44, the engagement lugs 39 and 40 undergo upward movement, and the recesses 39a and 40a fit the step parts 44a smoothly, and the engagement lugs 39 and 40 finally make contact with the upper lateral surfaces of the engagement holes 40 and 41.

Accordingly, the clamp plate 35 is attached to the bottom cover 28 through an extremely simple operation, as indicated in FIG. 7, and also by a two-dot chain line in FIG. 8.

Moreover, the clamp plate 35 is held stably against the leaf spring 33 by the pressure of its weight, and moreover, the recesses 39a and 40a at opposite sides thereof are engaged with the steps 44a. The clamp plate 35 has almost no play in the longitudinal direction thereof.

The steps formed in the opposite sides of engagement holes 40 and 41 constitute an attaching mechanism for the clamp plates to be attached adjacent to the above clamp plate 35. Accordingly, as a whole, a small number of engagement holes may be sufficient.

The clamp plate 35 may be modified so that a single hook-shaped engagement lug is formed at a center part thereof, which lug is adapted to engage with a single engagement hole in the bottom cover.

Next, a preset tuning operation of the push putton type tuner appartus of the above described construction will be described with further reference with FIGS. 9A through 9C.

For tuning, the tuning knob 50 is turned manually. This manipulation causes the slide bar 25 and the slide plate 12, which are of unitary construction, and are associated with a pinion-rack mechanism (not shown) are thereby caused to slide in the direction indicated by arrow C or D. A side ways movement of the slide bar 25 causes cores 51 fixed thereto to move in-and-out of their coils 52 mounted on the frame 16. In this way, tuning of the tuner is varied and a desired station is tuned.

Figure 9A:
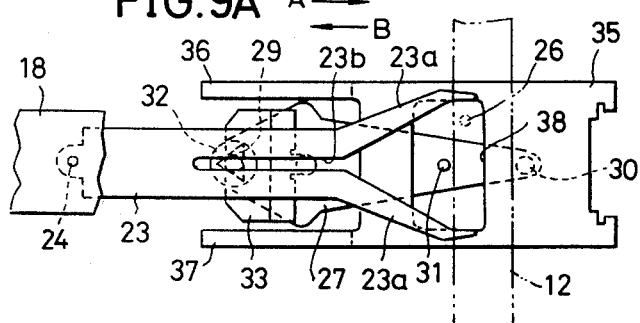
FIGS. 9A, 9B, and 9C are plan views of a mechanism constituting an essential part of the present invention, at different stages of the preset tuning procedure.

When the desired station is tuned, the reference pin 26 beneath slide plate 12 moves inside of the opening 38 of the clamp plate 35 to a predetermined position indicated in FIG. 9A.

In conjunction with sliding movement of the slide plate 12, a pointer 53 moves in the direction indicated by arrow C or D along a display panel (not shown).

Then, an arbitrarily selected push button 11 is pushed in the direction indicated by arrow A. This push button 11 has been pulled with respect to the push plate 18 and held as indicated by a two-dot chain line in FIG. 1. The pushing manipulation cause the comparator 23 to move in the same direction. The comparator 23 is guided by its V-shaped prongs 23a by the reference pin 26 at the predetermined position, hence undergoes rotation movement, and finally is held at a position, with the guide groove 23a tightly embracing the pin 26, as indicated in FIG. 9B.

When the comparator 23 moves in the direction indicated by arrow A and moreover undergoes rotation in conformance with the reference pin 26, the upstanding pin 31 of the memory plate 27 at any rotation position is subjected to guidance by the V-shaped prongs 23a and then enters the guide groove 23b, in a close fit relationship. Accordingly, the memory plate 27 and the pin 31 are rotated to a predetermined position where the pin 31 is aligned with the reference pin 26 of the slide plate 12. Further movement of the push plate 18 in the direction indicated by arrow A is limited by the top cover 17.

The push button 11 is further pressed and moves by itself with respect to the push plate 18 in the direction indicated by arrow A and is held by the action of the leaf spring 21 at a predetermined position. In conjunction with motion of the push button 11 itself, the lock plate 22 moves in the same direction. As the lock plate 22 moves, the pair of projections 22a respectively ride up over the clamp arms 36 and 37 to rotate the clamp plate 35 downwards counter to the leaf spring 43, as indicated in FIG. 4. The clamp plate 35 thereby clamps the memory plate 27 at the above described position of rotation onto the bottom cover 28, as described hereinafter.

When pushing of the push botton 11 is stopped, the push button 11, the push plate 18, and the comparator 23 unitarily move in the direction indicated by arrow B and return to their original positions, while the lock plate 22 is left in its operative position. The push button 11 is returned to a position indicated by a full line in FIG. 1.

Thus, preset tuning is completed.

Next, an operation for retuning will be described.

Preceding retuning operation, the slide plate 12 has been left in an arbitrary position, and another station has been tuned.

For retuning, the push button 11 is simply pushed. The comparator 23 is now guided by the reference pin 31 of the memory plate 27 which has been clamped at a predetermined position, and rotates to a position where the guide groove 23b thereof closely engages the pin 31. In conjunction with the rotational and forward motion of the comparator 23, the pin 26 of the slide plate 12 is guided by the V-shaped prongs of the comparator 23 and enter the guide groove 23b. Accordingly, the slide plate 12 undergoes displacement smoothly together with the coils 51 by the comparator 23 to a position corresponding to the pin 31, which position is the same as that at the time of preset tuning, whereby the above desired station is retuned.

When the push button 11 is depressed, the mechanical connection between the slide plate 12 and the manual tuning mechanism 14 is disconnected, whereby the sliding load of the slide plate 12 becomes small.

When pushing is stopped, the push button 11 slides back in the direction indicated by arrow B.

Here, out of the above described operations, the operation of the clamp plate 27 upon clamping, and lock plate clamping operation will be described in further detail.

Figure 6:
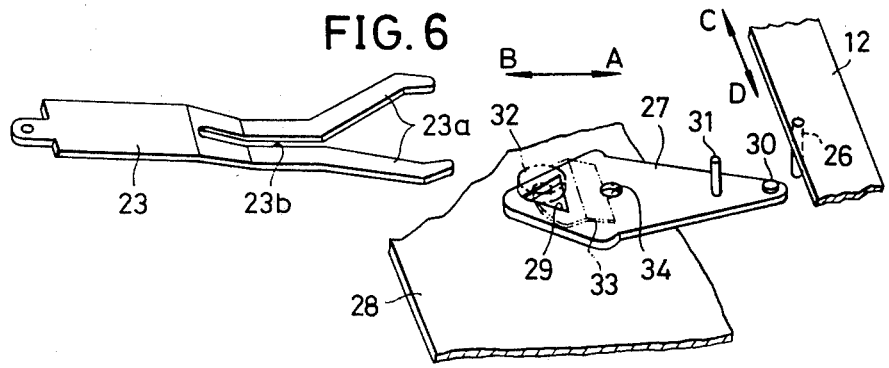
FIG. 6 is an exploded perspective view of the essential part of the present invention shown in FIG. 5.
Figure 9B:
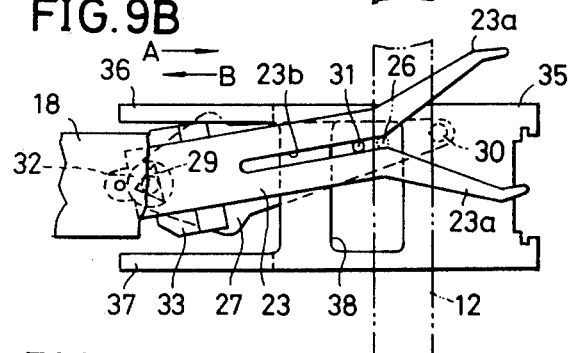
Figure 9C:
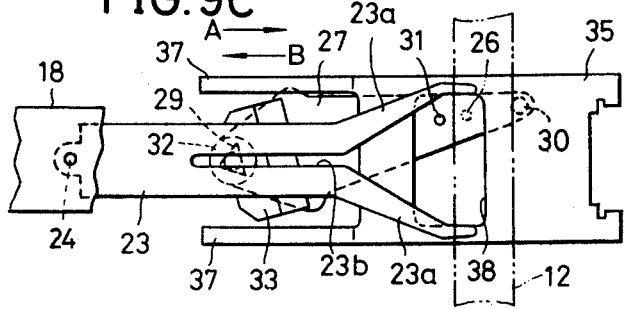

When the memory plate 27 is caused to be turned by the comparator 23, as indicated in FIG. 6, FIG. 9A, and FIG. 9B, the pin 31 of the memory plate 27 is contacted and guided by the V-shaped prongs 23a of the comparator 23. As the pin 21 is guided by the V-shaped prongs 23a, a force is exerted on the memory plate 27 in the direction indicated by arrow A extending along the longitudinal center line thereof. The memory plate 27 therefore moves in the direction of arrow A for the distance determined by the amount of play between the triangle hole 29 and the pin 32, and the triangle hole 29 and the pin 32 assume a positional relationship as indicated in FIG. 10. That is, in the triangle hole 29, two lateral wall surfaces 29b and 29c which make a vertical angle at the vertex 29a make contact with the circular cylinder 32a of the pin 32, at points P and Q. These two different positions P and Q are located on a circular arc m with a clamped part, i.e., a projection 30 of the memory plate 27, as center and, moreover, are located at positions symmetrical with respect to the longitudinal axis line l of the memory plate 27.

Accordingly, in the above clamped state contact relationship between the triangle hole 29 and the pin 32 is stable and does not change, even if the unwanted rotation force about the clamped part is applied to the memory plate 27.

Therefore, no shifting of the reference pin 31 occurs, and preset tuning and reset tuning thereby can be carried out with high accuracy.

The memory plate 27 is pressed against the bottom cover 28 by the leaf spring 33, and its displacement is restricted in the direction of thickness thereof. Accordingly, the positions where the above lateral wall surfaces 29b and 29c contact the pin 32 does not shift in the axial direction of the pin 32, and thereby are maintained at the predetermined positions in the axial direction of the pin 32.

As a result, the pivot part of the memory plate 27 is held stably also in the axial direction of the pin 32, and displacement of the pin 31 due to floating of the memory plate 27 at its pivotal part does not occur, thus ensuring preset tuning and reset tuning with further high accuracy.

Moreover, the memory plate 27 may be modified by forming with a round hole 54, and the round hole 54 is fitted on a pin 55 having a semi-circular section and embedded in the bottom cover 28, as indicated in FIG. 11. In this modification, the pivot part of the memory plate 27 assumes contact at two different positions $P_1$ and $Q_1$, and the memory plate 27 is maintained stably, as in the preceding case.

Further modification may be made. For example, a circular cylindrical pin 56 may be fixed to the lower surface of the memory plate 27, and this pin 56 is fitted into a triangle hole 57 formed in the bottom cover 28, as indicated in FIG. 12. In this modification, the pivot part of the memory plate 27 assumes contact at two different positions $P_2$ and $Q_2$, and the memory plate 27 is also maintained stably.

In another modification, a pin 58 having a semi-circular section is embedded in the lower surface of the memory plate 27, and this pin 58 is fitted into a round hole 59 of the bottom cover 28, as indicated in FIG. 13. In this modification, the pivot part of the memory plate 27 assumes contact at different two positions $P_3$ and $Q_3$, and the memory plate 27 is also stably maintained.

Next to be described is the memory plate 27 in clamped condition with reference to FIG. 14.

When the memory plate 27 is to be clamped, the clamp plate 35 is pressed by free ends of the clamping arms 36 and 37 by a pair of locking projections 22a and is turned counterclockwise about parts engaging with the engagement holes 40 and 41. The clamp plate 35 makes contact, near its rotation center, with the projection 30 of the memory plate 27 and presses downwards, thus clamping the memory plate 27 between the clamp plate 35 and the bottom cover 28.

Assuming that the clamp plate 35 is pressed by a force $F_1$, then the force $F_2$ by which the clamp plate 35 presses the projection 30 of the memory plate 27 is expressed by the following equation $$F_2 = F_1 \cdot L_1 / L_2$$

in which $L_1$ is the distance between the center of rotation of the clamp plate 35 and a point of the clamp plate 35 where it is pressed by the projections for locking 22a, and $L_2$ is the distance between the center of rotation of the clamp plate 35 and a point of the clamp plate 35 pressing the projection 30.

Here, as apparent from FIG. 14, the distance $L_1$ is approximately four and half times the distance $L_2$. Thus, the clamping force $F_2$ becomes $4\frac{1}{2}$ times as large as the force of action $F_1$, whereby the memory plate 27 is securely clamped with great force.

Here, the case of causing the memory plate 27 thus having been clamped to turn forcibly about the pivot part is considered. For turning the clamped memory plate 27, there is required a moment larger than a moment M, which is expressed by $$M = F_2 \cdot \mu \cdot L_3$$

in which $\mu$ is the coefficient of static friction of the clamp plate 35 on the projection 30, and $L_3$ is the distance between the pivot part of the memory plate 27 and the projection.

The projection 30 is disposed at the free end of the memory plate 27, that is, at the position farthest far from the center of rotation of the memory plate 27, whereby the above described distance $L_3$ becomes fairly large. Accordingly, the above moment M becomes, also aided by the large clamping force $F_2$, a considerably large value. Therefore, the memory plate 27 is positively held in its initial position even in case a large unwanted external force is applied, thus ensuring no deviation in tuning frequency at the time of returning.

Moreover, the clamp plate 35 is attached to the engagement holes 41 and 42, with little play, and no undesired motion of the clamp plate 35 occurs in the clamping operation. Accordingly, there is no shifting of the memory plate 27 due to displacement of the clamp plate 35.

Here, an instance where the external force is applied particularly to the pin 31 is considered. The pin 31 is disposed away from the projection 30 toward the pivot part of the memory plate 27. Accordingly, for rotating the memory plate 27 under clamped condition, it is necessary to apply a force somewhat larger than the force $\mu \cdot F_2$ to the pin 31. Therefore, when only the usual force is exerted on the pin 31, the memory plate 27 absolutely does not move from the clamped position, which ensures that retuning can be carried out with high accuracy and that reliability and performance of the apparatus can be greatly improved.

When the memory plate 27 is to be released from its clamped state, the push button 11 which has returned to its original position is pulled further in the direction indicated by arrow B. This manipulation causes the push button 11 to move independently of the push plate 18 to be reached at a position indicated by the two-dot chain line in FIG. 1. Together with the push button 11, the lock plate 22 moves in the same direction, and the projections 22a are disengaged from the clamp arms 36 and 37 of the clamp plate 35. The clamp plate 35 thus disengaged is turned upwards by the leaf spring 43, and the memory plate 27 is released from its clamped condition and assumes a freely rotatable state.

Further, this invention is not limited to these embodiments but various variations and modifications may be made without departing from the scope of the invention.

What is claimed is:

1. A push button type tuning apparatus comprising a plurality of push buttons fixed to their associated push plates and adapted to be pressed at the time of preset tuning and retuning operations;

lock plates provided on each of said push plates and having a pair of locking projections at opposite lateral sides thereof, one on each side;

memory plates provided rotatably with repect to each of said push buttons;

clamp plates having, at opposite lateral sides thereof, a pair of clamping arms one on each side, extending along said push plate and provided in a displaceable manner with respect to each of said push buttons, said clamp plate is being pressed responsive to pre-set tuning manipulation, at said clamping arms thereof by said locking projections of said lock plate to undergo displacement for clamping said memory plates;

a slide plate adapted to slide in connection wth a tuning part on manual tuning operation or retuning operation by said push buttons; and comparators pivotally supported on push plate to which said push buttons are fixed and having restriction parts, said restriction parts restricting said memory plate to a a position registered with said slide plate on preset tuning, and restricting said slide plate to a position registered with said memory plate as clamped on retuning, said comparators being disposed to extend between said pair of clamping arms of said clamp plates, and said memory plate having a journal-bearing part constituting of a pin and a hole, so that said pin and said hole make contact with each other at two separate points.

2. A push button type tuner apparatus as claimed in claim 1 wherein said hole of the journal-bearing part of said memory plate is a triangle hole formed in said memory plate, and said pin is a round pin which is fixed to an apparatus structure and engaged with said triangle hole, whereby two lateral wall surfaces of said triangle hole make contact with said pin at different points.

3. A push button type tuner apparatus as claimed in claim 1 wherein said pin of the journal-bearing part of said memory plate is a round pin fixed in said memory plate, and said hole is a triangle hole which is formed in an apparatus structure and is fitted on said pin, whereby said pin makes contact with two lateral side walls of the triangle hole at different points.

4. A push button type tuner apparatus as claimed in claim 1 said hole of the journal-bearing part of said memory plate is a round hole formed in said memory plate, and said pin is a pin having a semi-circular section, which is fixed in an apparatus structure and is engaged with said round hole, whereby a lateral wall surface of said round hole makes contact with said pin at two different points.

5. A push button type tuner apparatus as claimed in claim 1 wherein said pin of the journal-bearing part of said memory plate comprises a pin having a semi-circular section, fixed in said memory plate, and said hole is a round hole formed in an apparatus structure and fitted to said pin, whereby said pin makes contact with a lateral wall surface of said round hole at two different points.

6. A push button type tuner apparatus as claimed in claim 1 which further comprises a leaf spring member for urging said memory plate toward an apparatus structure.

7. A push button type tuner apparatus as claimed in claim 1 wherein: said clamp plate is rotatably attached to an apparatus structure and having said pair of clamping arms at a free end side separated from a rotational fulcrum thereof, said pair of clamping arms being imparted with a force to cause a part near said rotational fulcrum to apply a force of said memory plate for clamping said memory plate.

8. A push button type tuner apparatus as claimed in claim 7 wherein a memory plate has a clamped part applied with the clamping force by said clamp plate, said clamped part being at a position further away from a pin with respect to the journal-bearing part toward a free rotating side of said memory plate, and said pin being fixed in said memory plate and cooperating with said comparator.

9. A push button type tuner apparatus as claimed in claim 1 in which said clamp plate has hook-shaped engagement lugs comprising: recesses and hooks formed at a side opposite to said clamping arms, and an apparatus structure with openings for allowing said hooks of said engagement lugs to enter and steps adapted for engaging with said recesses, said clamp plate is insertable for allowing said hooks of said engagement lugs enter said openings and then being turned in a predetermined direction about a predetermined point so that said recesses engage with said steps and said clamp plate is securely attached to said apparatus structure.

10. A push button type tuner apparatus as claimed in claim 9 wherein said hook-shaped lugs for engagement is formed at opposite lateral sides of said clamp plate and projecting width direction thereof.

* * * * *